United States Patent [19]

McCann

[11] Patent Number: 4,564,885
[45] Date of Patent: Jan. 14, 1986

[54] RECTIFIER WITH SLUG CONSTRUCTION AND MOLD FOR FABRICATING SAME

[75] Inventor: T. Michael McCann, Taipei, Taiwan

[73] Assignee: General Instrument Corporation, New York, N.Y.

[21] Appl. No.: 648,672

[22] Filed: Sep. 10, 1984

[51] Int. Cl.⁴ .................. H01G 9/16; H01L 23/28; H01L 3/00
[52] U.S. Cl. ........................... 361/436; 249/119; 357/72
[58] Field of Search ............... 249/119, 117; 361/436; 357/72, 77

[56] References Cited

U.S. PATENT DOCUMENTS

| | | | |
|---|---|---|---|
| 2,359,801 | 10/1944 | Skinker | 357/77 X |
| 2,516,344 | 7/1950 | Ross et al. | 357/72 X |
| 2,780,758 | 2/1957 | Zetwo | 357/77 |
| 3,250,048 | 5/1966 | Coulon | 249/119 X |
| 3,274,457 | 9/1966 | Wislocky | 357/72 X |
| 3,291,894 | 12/1966 | Sampson | 357/72 X |
| 3,685,784 | 8/1972 | Spanjer | 249/117 X |
| 3,844,029 | 10/1974 | Dibugnara | 357/72 X |
| 3,869,701 | 3/1975 | Waltz | 357/72 |
| 3,996,602 | 12/1976 | Goldberg et al. | 357/72 |
| 4,525,133 | 6/1985 | Bergmann | 249/117 X |

Primary Examiner—Donald Griffin
Attorney, Agent, or Firm—James & Franklin

[57] ABSTRACT

A rectifier designed for leadless surface mounting on a P.C. board has a cylindrical body situated between two disk-like end parts. The end parts extend radially beyond the surface of the body defining a recess adapted to receive epoxy compound. A plurality of rectifiers are situated end-to-end within elongated cylindrical cavities in a mold. The end parts cooperate with the cavity walls to seal each individual recess when the mold halves are closed. Openings in the cavity wall aligned with each recess permit epoxy compound to enter each recess and be cured. Leads may be attached to the end parts after the molding operation to convert the rectifier into an axial lead device, if required.

12 Claims, 5 Drawing Figures

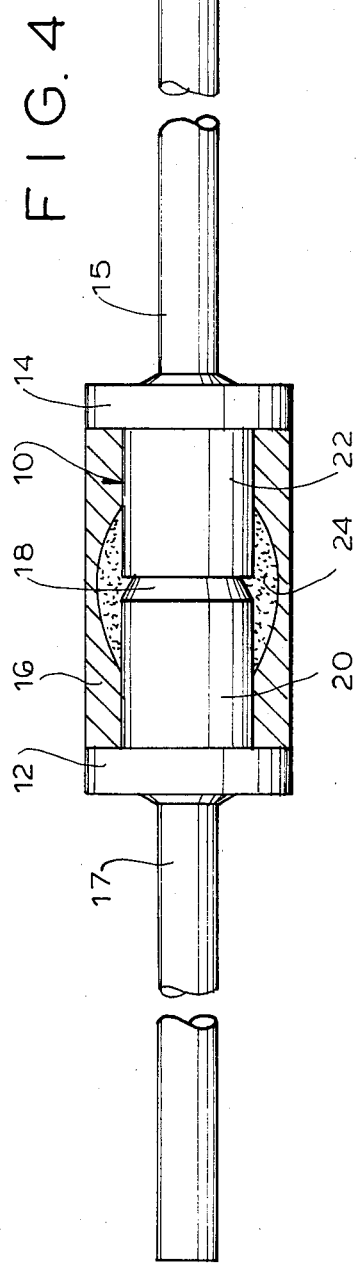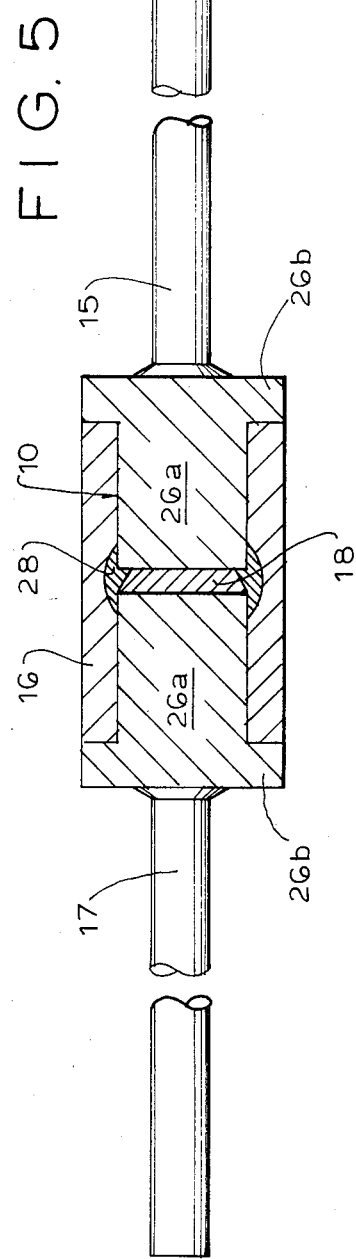

RECTIFIER WITH SLUG CONSTRUCTION AND MOLD FOR FABRICATING SAME

The present invention relates to discrete electrical components and methods for fabricating same and, more particularly, to a power rectifier with an improved construction which facilitates fabrication thereof and to a mold for use in fabricating same.

Molded axial lead power rectifiers are normally fabricated with soft copper wire termination leads extending from the ends thereof. Such leads are usually many times the length of the device itself. Because of this, the leads tend to deform during the manufacturing process, resulting in machine jamming and additional costs to restraighten the leads. In addition, the leads occupy a great deal of space, in fact, more space than the body of the device, reducing capacity of machinery and tooling. The care, attention, and special tooling required to handle the delicate leads, plus the scrap resulting from damaged leads, adds unnecessary costs to the device and limits the capacity of the manufacturing equipment.

The latest technology for assembling printed circuit boards, where most power rectifiers are used, involves the use of leaderless devices with the means to make contact to a solder pad on the surface of the printed circuit board, rather than the threading of wire leads through holes in the printed circuit board. Although this technology has recently gained acceptance for the assembly of resistors and capacitors, it has not as yet been able to be applied to rectifiers. Although several attempts have been made to develop a leaderless rectifier, no previous known manufacturing techniques have been able to retain the reliability, performance, or cost advantages of axial lead version.

The process for fabricating a power rectifier includes a step in which an epoxy compound layer is positioned around the cylindrical body of the rectifier. In a leaderless rectifier, a recess can be defined between two end parts or disk-like members which extend radially beyond the surface of the rectifier body and between which the epoxy compound is applied.

Conventional molding technology requires a mold with an individual cavity for each device for applying the compound and a means for delivering the epoxy compound to each individual cavity. A plurality of devices with end parts of the type described above cannot be molded at the same time in a single elongated mold cavity because the radially extending end parts prevent the epoxy compound from flowing along the cavity and into each of the recesses defined by the device bodies. Leaderless device development has therefore followed a glass body/non-molded approach where the devices are powder coated. This results in device costs which are significantly higher than axial lead devices.

Conventional mold designs with individual mold cavities for each device have proven costly, very difficult to manufacture, and ineffective in terms of capacity and molding quality. Such molds necessitate a complicated assembly of many intricate, high precision parts. A typical mold may contain 240 cavities, half of each cavity being the bottom half of the mold, and the other half requiring precise alignment with the top half of the mold.

In the present invention, the molding problem is overcome by fabricating the mold with elongated, cylindrical cavities, each of which receives a plurality of the devices nested end-to-end. The inner diameter of the cavity walls is equal to the outer diameter of the end parts, such that when the mold halves are closed, the end parts cooperate with the cavity walls to seal each individual recess. Openings or gates are provided at spaced intervals in the cavity walls, in alignment with each individual recess, to permit the epoxy compound to flow into each individual recess and be cured.

In this manner, the end parts, which are an integral part of the device itself, are effectively employed to define individual mold cavities. This substantially reduces the cost of the mold and permits the devices to be fabricated very inexpensively.

In addition, the leaderless devices may, after the molding procedure, have leads attached to the ends thereof, if required. In this way, the same manufacturing facilities can be used to manufacture both leaderless or lead bearing devices.

It is, therefore, a prime object of the present invention to provide a rectifier with a slug construction and a mold for fabricating same wherein the end parts of the device itself are utilized to define the cavities within the mold.

It is another object of the present invention to provide a rectifier with a slug construction and a mold for fabricating same wherein leaderless devices can be produced with the same reliability and performance characteristics of conventional axial lead devices, but at substantially reduced cost.

It is another object of the present invention to provide a rectifier with a slug construction and a mold for fabricating same wherein the requirement for individual mold cavities is eliminated.

It is another object of the present invention to provide a rectifier with a slug construction and a mold for fabricating same in which a leaderless device is produced which can easily be converted into a lead bearing device.

It is another object of the present invention to provide a rectifier with a slug construction and a mold for fabricating same which eliminates the high costs and inefficiencies of processing axial lead assemblies.

It is another object of the present invention to provide a rectifier with a slug construction and a mold for fabricating same wherein the necessity for a complicated assembly of many intricate high precision parts in the mold is eliminated.

It is another object of the present invention to provide a rectifier with a slug construction and a mold for fabricating same which results in savings in mold costs, mold material usage, direct labor at molding, and increases mold press capacity.

In accordance with the present invention, a rectifier is provided comprising a substantially cylindrical body situated between first and second end parts to form a unit. The end parts extend radially beyond the surface of the body and define therebetween a recess adapted to receive a molding compound. The compound is applied by injecting the compound into the recess when the unit is situated within a substantially cylindrical cavity in a mold. The cavity has a diameter substantially equal to the diameters of the end parts and is substantially longer than the unit. The end parts cooperate with the cavity walls to substantially seal the recess from the remainder of the cavity. The compound is injected into the recess through an opening in the cavity wall aligned with the recess and is thereafter cured.

The body includes a diffused silicon dice sandwiched between substantially cylindrical slugs. A layer surrounds the body and covers the termination junctions between the dice and the slugs. The end parts preferably comprise substantially disk-like copper members. The slugs may be composed of molybdenum or copper. In the latter case, the end parts are preferably integral with the slugs.

In accordance with another aspect of the present invention, a method of applying molding compound to a plurality of electrical components is provided. The electrical components are of the type including a substan-tially cylindrical body situated between end parts radially extending beyond the surface of the body, to form a recess therebetween. The recess is adapted to receive the compound. The method comprises the steps of placing the components, end-to-end, in a substantially cylindrical cavity in a mold. The diameter of the mold cavity is substantially equal to the diameters of the end parts. The end parts of each component cooperate with the cavity wall to substantially completely seal each recess. The compound is introduced into each of the recesses separately. Thereafter, the compound is cured. Leads may thereafter be attached to the end parts, if desired.

In accordance with another aspect of the present invention, a mold is provided for applying compound to a plurality of electrical components. The electrical components are of the type comprising a substantially cylindrical body situated between end parts radially extending beyond the surface of the body, to form a recess therebetween. The recess is adapted to receive the compound. The mold comprises an elongated, substantially cylindrical cavity adapted to receive the components, end-to-end. The diameter of the cavity is substantially equal to the diameters of the end parts. The end parts cooperate with the cavity wall to substantially seal each recess. A plurality of spaced openings are provided in the cavity wall. Each of the openings is aligned with a different one of the recesses to permit the compound to enter.

The mold also includes a conduit situated proximate one side of the cavity which is connected to each of the openings. The conduit is adapted to transfer fluid compound from outside the mold to the openings. The mold may also comprise a second cavity situated on the opposite side of the conduit. The second cavity has a plurality of openings therein connected to the conduit.

To these and to such other objects which may hereinafter appear, the present invention relates to a rectifier with a slug construction and a mold for fabricating same, as described in detail in the following specification and recited in the annexed claims, taken together with the accompanying drawings, wherein like numerals refer to like parts and in which:

FIG. 4 is a cross-sectional view of a first preferred embodiment of a rectifier with a slug construction in accordance with the present invention; and FIG. 5 is a cross-sectional view of a second preferred embodiment of a rectifier with a slug construction in accordance with the present invention.

Figure 1:
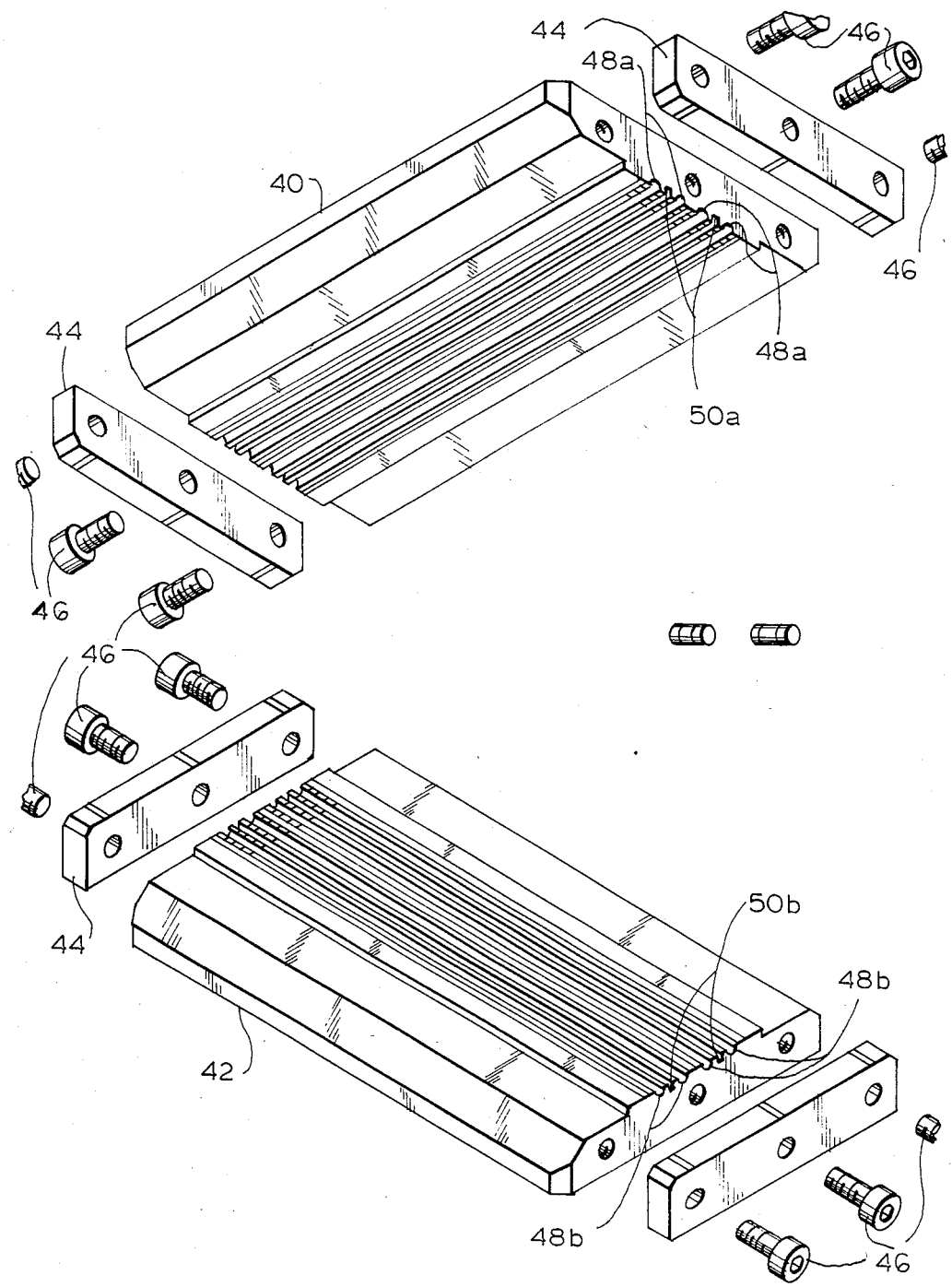
FIG. 1 is an exploded isometric view of a mold for fabricating a rectifier with a slug construction in accordance with the present invention.

As illustrated in FIG. 4, the first preferred embodiment of the rectifier of the present invention includes a substantially cylindrical body 10 and first and second substantially disk-shaped end parts 12, 14. End parts 12, 14 have diameters which are larger than the diameter of the body 10 such that they extend radially outwardly beyond the surface thereof. The surface of body 10 and the interior surfaces of the outwardly extending portions of end parts 12 and 14 define a circumferential body recess into which an epoxy compound 16 is received. Epoxy compound 16 is applied to the device utilizing a unique mold, the structure of which is disclosed in detail below.

Body 10 includes a diffused silicon dice 18 sandwiched between two slugs 20, 22, preferably composed of molybdenum or the like, which are brazed thereto. End parts 12 and 14 are preferably composed of copper and are, in turn, brazed to the exposed ends of slugs 20 and 22.

The body is then emersed in acid such that the termination or surface junction between dice 18 and slugs 20 and 22 is etched. After the etching procedure, a glass slurry 24 is applied to the junction area. After the slurry is applied, the assembly is placed in a mold where epoxy compound 16 is formed around the body and between the two end parts 12 and 14.

After the molding process, end parts 12 and 14 are tin- or solder-coated. Finally, the assembly is electrically tested, sorted, and marked with brand and identification codes. At this stage, the device is complete for use in a surface mounted application and is packed and shipped.

Axial lead devices can be produced from the same assembly. Pre-plated copper wires 15, 17 can be percussion welded to the end parts before packing and shipping in order to convert the leaderless device into an axial lead device.

FIG. 5 illustrates a second embodiment of the present invention wherein the end parts are integral with the slugs. In this embodiment, the silicon dice 18 is situated between a pair of copper slugs 26. Each slug 26 comprises a substantially cylindrical part 26a, which corresponds in configuration to slugs 20 and 22 of the first preferred embodiment and an end portion 26b which corresponds in configuration to the end parts 12 and 14 of the first preferred embodiment. Slugs 26 are soldered to either side of the silicon dice 18 and the termination junction therebetween along the body surface is coated with silastic 28 after etching, instead of the glass coating utilized in the first preferred embodiment. After the silastic layer 28 is formed, epoxy compound 16 is molded around body 10, as in the previous embodiment. The end portions 26b of slugs 26 are then tin- or solder-coated and leads 15, 17 may be percussion welded to the ends, as in the first preferred embodiment.

Figure 2:
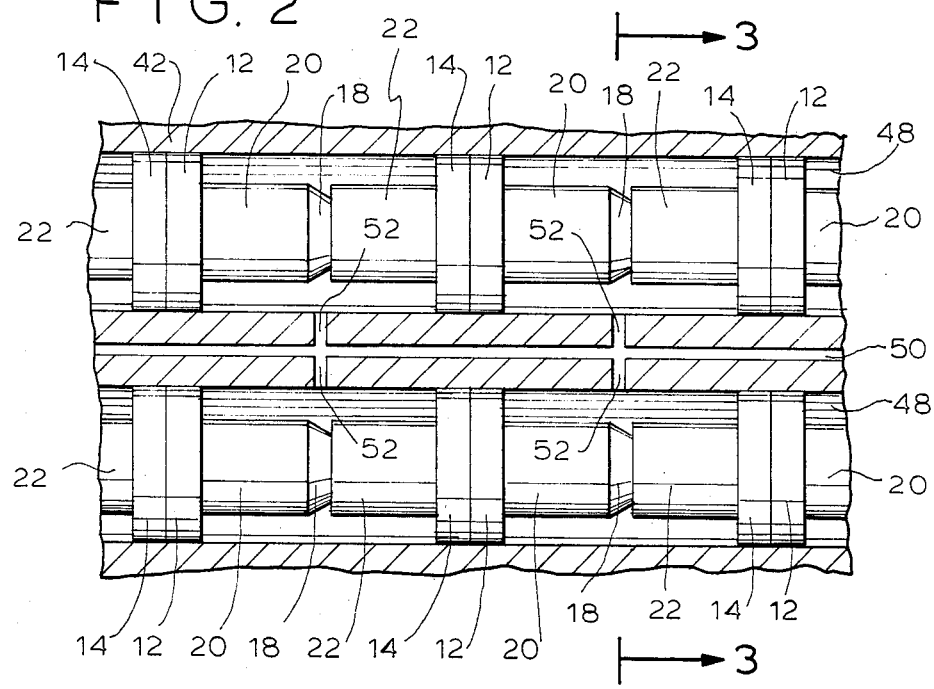
FIG. 2 is an enlarged fragmentary horizontal section of the mold illustrated in FIG. 1 showing rectifiers of the present invention situated therein prior to introduction of the molding compound.
Figure 3:
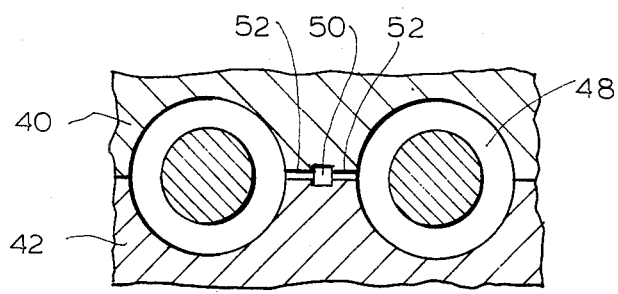
FIG. 3 is a cross-sectional view taken along line 3—3 of FIG. 2.

In either embodiment, the application of the epoxy compound within the recess defined by the exterior surface of the cylindrical body and the interior surfaces of the portions of the outwardly extending end parts is achieved in a mold of unique construction, as illustrated in FIGS. 1–3. The mold consists of a top half 40 and a bottom half 42. Each of the halves 40 and 42 are provided with end pieces 44 which are mounted thereto by screws 46 or the like. Each mold half 42, 44 is provided with a plurality of spaced substantially parallel grooves 48a, 48b, each having a semi-circular cross-section, such that when the mold halves are aligned and placed together, a plurality of substantially cylindrical elongated cavities 48 are formed.

Situated between each pair of cavities 48 is a conduit or runner groove 50a, 50b which is shown as having a substantially rectangular cross-section, but may be of any suitable structure. When mold halves 40, 42 are closed, conduits or runners 50 are formed. Each conduit or runner 50 is connected to each of the adjacent cavities 48 through a plurality of openings or gates 52 (FIGS. 2 and 3) which are situated at spaced intervals along each side of the conduit. Openings or gates 52 are situated within the walls of cavities 48 at spaced intervals so that they will align with the compound receiving recess of the devices when the devices are situated end-to-end within the cavities.

Once the devices are situated end-to-end within cavities 48, as seen in FIG. 2, and the mold halves are closed, the outer surfaces of end parts 12, 14 cooperate with the cavity walls to isolate each recess from the remainder of the cavity. The epoxy compound, in fluid form, is then forced through conduits 50 and gates 52 such that each individual recess, defined between the end parts of the individual devices, is filled with the compound. The compound is then cured. After curing, the mold parts are opened and the devices, with the epoxy compound molded thereon, are removed from cavities 48.

From the above explanation of the mold structure, it should be clear that the mold of the present invention does not require a single cavity for each individual device, as is the case with conventional molds, but, instead, each elongated cylindrical cavity is used for a plurality of devices which are situated therein end-to-end. Because the inner diameter of the elongated cylindrical cavity wall is substantially equal to the outer diameter of the end parts of each device, the end parts cooperate with the cavity walls, when the mold is closed, in order to seal the recess associated with each device from the remainder of the cavity and, thus, from the recesses associated with adjacent devices.

The end parts of each device function in a manner comparable to that of the end portions of individual mold cavities and, thus, portions of the device itself are utilized to "simulate" individual mold cavities. This permits a large number of devices to be processed at one time and, in addition, substantially decreases the costs associated with the manufacture and operation of the mold. Both of these factors contribute substantially to reducing the cost of the devices.

After the molding operation is complete and the components have been removed from the mold, the components can be used as leaderless devices. Alternatively, the components can have leads attached thereto to form axial lead devices.

While only a limited number of preferred embodiments of the present invention have been disclosed herein for purposes of illustration, it is obvious that many modifications and variations could be made thereto. It is intended to cover all of these variations and modifications which fall within the scope of the present invention, as defined by the following claims:

I claim:

1. A rectifier comprising a substantially cylindrical body situated between first and second end parts to form a unit, said end parts extending radially beyond the surface of said body and defining therebetween a recess adapted to receive a molding compound applied by injecting the compound into the recess when the unit is situated within a substantially cylindrical cavity in a mold, the cavity having a diameter substantially equal to the diameters of said end parts and being substantially longer than said unit, the end parts cooperating with the cavity walls to substantially seal said recess from the remainder of the cavity, the compound being injected into the recess through an opening in said cavity wall aligned with the recess.

2. The rectifier of claim 1, wherein said body comprises a diffused silicon dice sandwiched between substantially cylindrical slugs and a layer surrounding said body and covering the termination junctions between said dice and said slugs.

3. The rectifier of claim 2, wherein said end parts comprise substantially disk-like copper members.

4. The rectifier of claim 3, wherein said slugs are composed substantially of copper.

5. The rectifier of claim 4, wherein said end parts are integral with said slugs.

6. The rectifier of claim 2, wherein said slugs are composed substantially of molybdenum.

7. The rectifier of claim 1, further comprising leads attached to said end parts.

8. The method of applying molding compound to a plurality of electrical components of the type comprising a substantially cylindrical body situated between end parts radially extending beyond the surface of the body to form a recess therebetween adapted to receive the compound, the method comprising the steps of placing the components, end-to-end, in a substantially cylindrical cavity within a mold, the diameter of the cavity being substantially equal to the diameters of the end parts, the end parts of each component cooperating with the cavity wall to substantially completely seal each recess, separately introducing the compound into each of the recesses and curing the compound.

9. The method of claim 8, further comprising the step of attaching leads to said end parts of each component.

10. A mold for applying compound to a plurality of electrical components of the type comprising a substantially cylindrical body situated between end parts radially extending beyond the surfaces of the body to form a recess therebetween adapted to receive the molding compound, the mold comprising an elongated, substantially cylindrical cavity adapted to receive the components, end-to-end, the diameter of said cavity being substantially equal to the diameters of the end parts, the end parts cooperating with the cavity wall to substantially seal each recess, a plurality of spaced openings in said cavity wall, each of said openings being aligned with a different one of said recesses to permit the molding compound to enter therein.

11. The mold of claim 10, further comprising a conduit situated proximate one side of said cavity and connected to each of said openings, said conduit being adapted to transfer fluid molding compound from outside said mold to said openings.

12. The mold of claim 11, further comprising a second cavity situated on the opposite side of said conduit, said second cavity having a plurality of openings therein connected to said conduit.

* * * * *